US007944121B2

(12) United States Patent
Pulskamp et al.

(10) Patent No.: US 7,944,121 B2
(45) Date of Patent: May 17, 2011

(54) NEGATIVE VERTICAL DEFLECTION PIEZOELECTRIC MEMS ACTUATORS AND METHOD OF FABRICATION

(75) Inventors: Jeffrey Spencer Pulskamp, Mclean, VA (US); Ronald G. Polcawich, Derwood, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 187 days.

(21) Appl. No.: 12/195,522

(22) Filed: Aug. 21, 2008

(65) Prior Publication Data
US 2010/0045142 A1 Feb. 25, 2010

(51) Int. Cl.
*H01L 41/04* (2006.01)
*H02N 2/04* (2006.01)
(52) U.S. Cl. ........................................ 310/328; 310/330
(58) Field of Classification Search ................. 310/324, 310/328, 330–332
See application file for complete search history.

(56) References Cited

U.S. PATENT DOCUMENTS

| 2001/0005213 A1* | 6/2001 | Ikeda et al. | 347/70 |
| 2007/0226974 A1* | 10/2007 | Li | 29/25.35 |
| 2008/0225089 A1* | 9/2008 | Tsukamoto | 347/72 |

* cited by examiner

*Primary Examiner* — Derek J Rosenau
(74) *Attorney, Agent, or Firm* — Avrom David Spevack; Alan I. Kalb

(57) ABSTRACT

Co-fabricating of vertical piezoelectric MEMS actuators that achieve large positive and negative displacements through operating electric fields in excess of the coercive field includes forming a large negative displacement vertical piezoelectric MEMS actuator, forming a bottom structural dielectric layer above a substrate layer; forming a bottom electrode layer above the structural dielectric layer; forming an active piezoelectric layer above the bottom electrode layer; forming a top electrode layer above the active piezoelectric layer; forming a top structural layer above the top electrode layer, wherein the x-y neutral plane of the negative displacement vertical piezoelectric MEMS actuator is above the midplane of the active piezoelectric layer, wherein the negative displacement vertical piezoelectric MEMS actuator is partially released from the substrate to allow free motion of the actuator; and combining the large negative displacement vertical piezoelectric MEMS actuator and a large positive displacement vertical piezoelectric MEMS actuator on the same the substrate.

3 Claims, 9 Drawing Sheets

NEGATIVE VERTICAL DEFLECTION PIEZOELECTRIC MEMS ACTUATORS AND METHOD OF FABRICATION

BACKGROUND

1. Technical Field

The embodiments herein generally relate to microelectromechanical systems (MEMS) actuators, and, more particularly to piezoelectric MEMS actuators.

2. Description of the Related Art

MEMS piezoelectric actuators are the basic building blocks for complex electromechanical systems such as radio frequency (RE) MEMS, optical switching, robotics, and many more systems. Typically, piezoelectric actuators outperform electrostatic actuators as they have lower power consumption, smaller size, smaller actuation voltages, and tend to attain greater displacements.

In most conventional piezoelectric actuators, as shown in FIGS. 1(A) and 1(B), the structure includes a structural dielectric layer 104 on top of which the bottom electrode 103 is present. The piezoelectric layer 102 is on top of this bottom electrode 103 and is generally made of lead-zirconate-titanate (PZT), zinc oxide (ZnO), or aluminum nitride (ALN). A top electrode 101 is positioned above the piezoelectric layer 102. The x-y neutral plane of the structure is below the mid-plane of the piezoelectric layer 102 under this configuration. When a voltage is applied between the electrodes 101, 103 a strain is produced which leads to an axial force acting on the midplane of the piezoelectric layer 102. This force acts at a perpendicular distance from the neutral axis and results in a bending moment that generates an out-of-plane upward deflection of the entire actuator structure. FIG. 2 illustrates a coordinate system and depiction of neutral planes on the conventional piezoelectric unimorph actuator of FIGS. 1(A) and 1(B).

At small voltages, with polarity opposite that of the poling direction of the ferroelectric/piezoelectric material, a vertical ferroelectric/piezoelectric MEMS actuator will generally deflect downward meaning they provide negative out-of-plane displacement. However, as the voltage increases to a value near the coercive field, the actuator will switch directions and will then bend upwards (out of the wafer plane). As the field strength is increased further, the actuator will continue to bend upward. If the opposite polarity voltage is applied, the actuator will bend upward (out of the wafer plane) for all voltages, Consequently, conventional vertical piezoelectric MEMS unimorph actuators using ferroelectric materials will only provide positive out-of-plane deflections for large operating voltages and are generally unable to attain large negative (out-of-the plane) deflections. There is also a need to have devices capable of positive or negative deflections, at large operating voltages, integrated onto the same substrate within the same batch fabrication MEMS manufacturing process.

SUMMARY

In view of the foregoing, an embodiment herein provides a method of co-fabricating vertical piezoelectric MEMS actuators that achieve large positive and negative displacements at high operating voltages, wherein the method comprises forming a large negative displacement vertical piezoelectric MEMS actuator by forming a bottom structural dielectric layer of silicon dioxide and coated with titanium on top of a silicon substrate with a thickness determined by the desired actuator performance; forming a bottom electrode layer above the structural dielectric layer of thickness approximately 700 Å; forming an active piezoelectric layer above the bottom electrode layer by depositing lead-zirconate-titanate (PZT) or any piezoelectric material of micron to sub-micron thickness; forming a top electrode layer using DC sputtered platinum above the active piezoelectric layer of thickness approximately 700 Å; forming a top structural layer above the top electrode layer; such that the x-y neutral plane of the actuator structure is above the mid-plane of the piezoelectric layer, patterning the bottom electrode layer and PZT layer to define the actuator structure, and releasing the actuator from the substrate; wherein the method further comprises combining a large negative displacement vertical piezoelectric MEMS actuator and a conventional large positive displacement vertical piezoelectric MEMS actuator on the same substrate within the same manufacturing process by selecting the thicknesses of the top structural layer of the negative displacement piezoelectric MEMS actuator, the shared piezoelectric layer, and the shared bottom structural dielectric layer to produce optimal displacement, force, or work outputs (for the intended actuator application) of both the co-fabricated large negative displacement vertical piezoelectric MEMS actuator and the conventional large positive displacement vertical piezoelectric MEMS actuator by using the formulas:

$$M_{act} = d_{31} V E_P w (H_{Pmid} - y_{bar})$$

$$y_{bar} = \frac{\sum_i A_i y_i}{A_{tot}}$$

where $M_{act}$ represents the piezoelectric actuation moment, $d_{31}$ is the high electric field effective piezoelectric coefficient, V is the applied voltage, $E_p$ is the elastic modulus of the piezoelectric, w is the beam width, $y_{bar}$ represents the distance between the x-y neutral axis and an arbitrary reference axis, $A_i$ represents elasticity weighted layer cross sectional areas corresponding to the "transformed section method", $y_i$ represents the distance between individual layer centroids and the arbitrary reference axis, $A_{tot}$ represents cross-sectional areas of all the layers in the piezoelectric MEMS actuator, $H_{Pmid}$ represents the distance between the mid-plane of the piezoelectric layer and the arbitrary reference axis. The difference between $H_{Pmid}$ and $y_{bar}$ is the value of the piezoelectric moment arm. With the value of the piezoelectric actuation moment, the actuator layer thicknesses and other geometries, and additional mechanics equations for force and displacement for various actuator geometries, boundary and loading conditions; optimal actuator performance can be achieved.

The embodiments further disclose a method of producing both negative displacement in a vertical piezoelectric MEMS actuator structure and a co-fabricated conventional positive displacement vertical piezoelectric MEMS actuator, both actuator structures comprising a bottom structural dielectric layer, a bottom electrode above the structural dielectric layer, an active piezoeleetric layer above the bottom electrode, a top electrode layer above the active piezoelectric layer, and the negative displacement vertical MEMS actuator further comprised of a top structural layer above the top electrode layer; which allows application of electric fields between the top and bottom electrodes without electrical breakdown between bottom and top electrode and bottom electrode and top structural layer, the method performing the steps of applying an electric field to both actuator structures.

These and other aspects of the embodiments herein will be better appreciated and understood when considered in conjunction with the following description and the accompanying drawings. It should be understood, however, that the following descriptions, while indicating preferred embodiments and numerous specific details thereof are given by way of illustration and not of limitation. Many changes and modifications may be made within the scope of the embodiments herein without departing from the spirit thereof; and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1A:
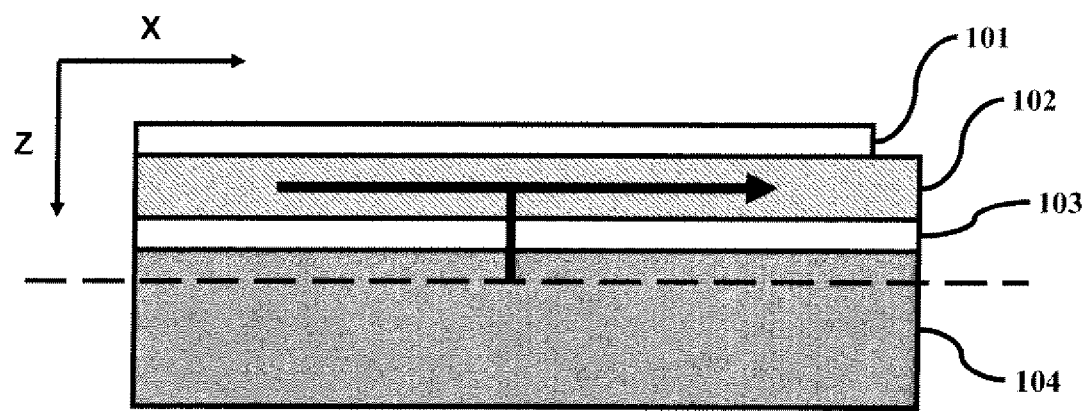
FIGS. 1(A) and 1(B) illustrate a conventional vertical piezoelectric MEMS unimorph actuator.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a piezoelectric MEMS actuator that can achieve large negative deflections by manipulating the location of the neutral axis of the structure with respect to the mid-plane of the piezoelectric thin film and provides a combination of a large negative displacement vertical piezoelectric MEMS actuator and a conventional large positive displacement vertical piezoelectric MEMS actuator on the same substrate within the same manufacturing process. Referring now to the drawings, and more particularly to FIGS. 3(A) through 9, where similar reference characters denote corresponding features consistently throughout the figures, there are shown preferred embodiments.

Figure 1B:
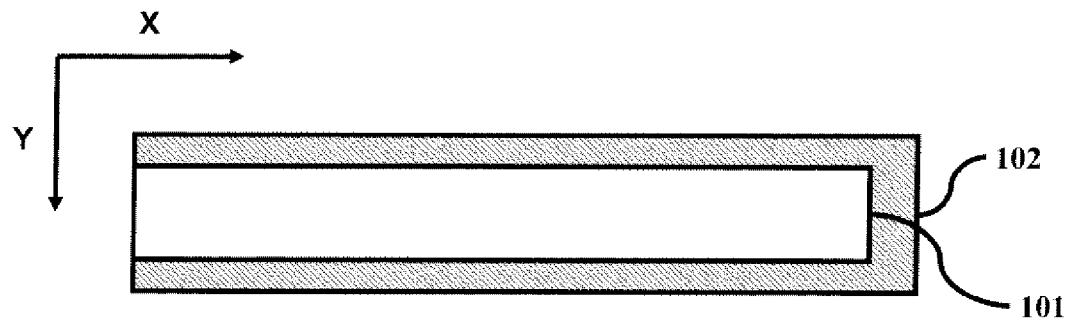
Figure 2:
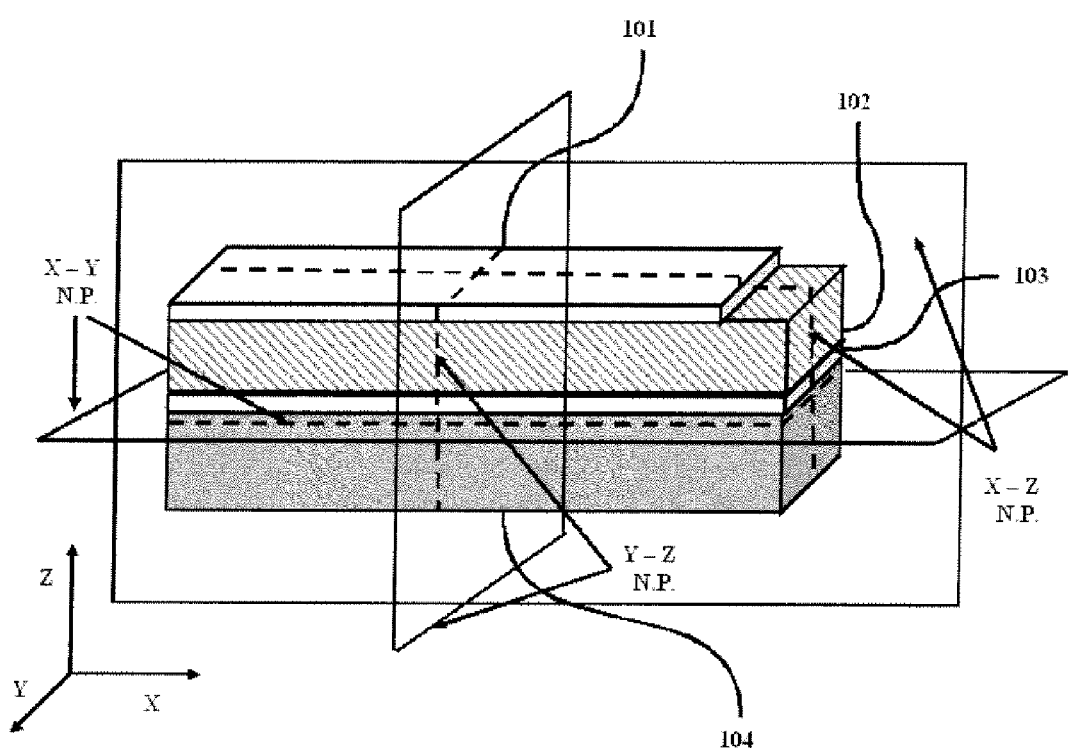
FIG. 2 illustrates a coordinate system and depicts neutral planes of the piezoelectric unimorph actuator of FIGS. 1(A) and 1(B)

The embodiments herein change the sense of the piezoelectrically generated moment arm in the standard MEMS piezoelectric composite stack of FIGS. 1(A) and 1(B), and thus, the sense of the piezoelectric bending moment, and consequently the sense of the large electric field value actuator deflection; in a manner compatible with also obtaining on the same substrate, devices with the traditional sense of the piezoelectrically generated actuator deflection. The change in the sense of the piezoelectrically generated arm movement is accomplished by thinning the bottom structural dielectric layer 104, typically used to displace the x-y neutral plane negatively from the piezoelectric layer mid-plane, and by adding an additional layer atop of the top electrode layer. The added top electrode material serves to displace the x-y neutral plane positively from the piezoelectric layer mid-plane. The embodiments herein make possible the integration of positive vertical and negative vertical piezoelectric MEMS actuators by maintaining the standard structural dielectric layer, adding a separate layer on top of the top electrode, and selecting the values of these thicknesses to achieve the integration compatible negative and positive displacement performance of the respective actuators.

Figure 3A:
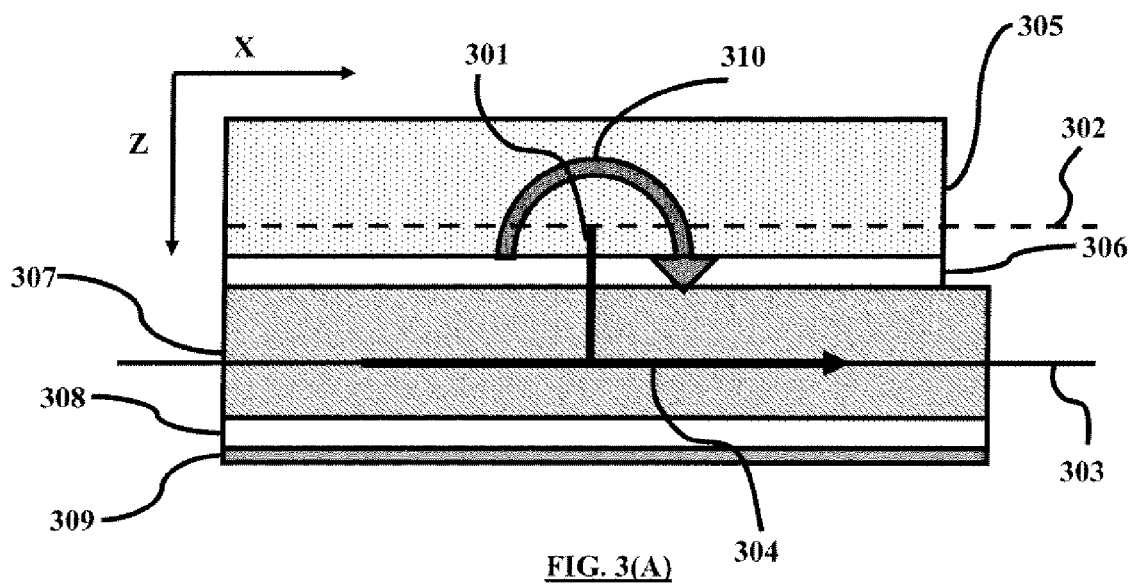
FIGS. 3(A) and 3(B) illustrate a negative vertical deflection piezoelectric MEMS actuator in accordance with embodiments herein.
Figure 3B:
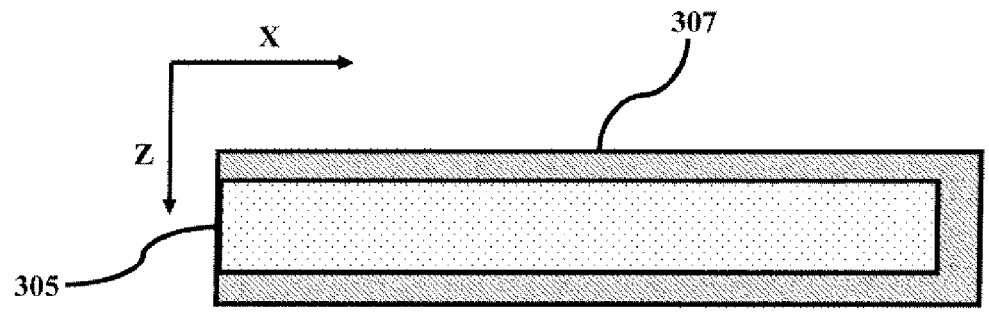

FIGS. 3(A) and 3(B) illustrate a negative vertical deflection piezoelectric MEMS actuator according to the embodiments herein. The piezoelectric composite stack actuator comprises of five layers. The bottom layer is a structural dielectric layer 309. If direct integration with positive displacement vertical piezoelectric MEMS actuators is not desired; the structural dielectric layer 309 is thinned, to the thinnest extent possible within the given process, to minimize its canceling effect upon the piezoelectric moment arm 301. The thicker the structural dielectric layer 309, the stiffer the structure becomes and the piezoelectric moment arm 301 is reduced, which serve to reduce overall actuator performance. Therefore, the integration of these devices involves the performance tradeoff between the positive and negative displacement actuator designs through the selection of these layer thicknesses. In some instances, thin film PZT for example, the layer 309 must remain (but can be significantly thinned from typical values) for process related reasons. The structural dielectric layer 309 prevents diffusion of the electrode materials into the substrate and therefore some finite thickness is required. The next layer is the bottom electrode layer 308 and is preferably approximately 700 Å in thickness. The layer above the bottom electrode layer is the active piezoelectric layer 307 and is preferably approximately 5000 Å in thickness. The next layer is a top electrode layer 306 and is preferably approximately 700 Å in thickness. A top structural layer 305 is also present. The top structural layer 305 could be made of either metallic or non-metallic material. The thickness of the structural layer 305 depends on the properties of the material which is used to fabricate the layer, thickness of the other layers in the piezoelectric stack and the mechanical properties of the structural layer 305. A proper understanding of the consequences of the high electric field nonlinearity in ferroelectric/piezoelectric materials like PZT and the associated nature of the mechanics of induced strain actuation (like piezoelectricity) has not been properly understood in the research and development community until the solution provided by the embodiments herein.

The actuator bends due to a voltage applied across the electrodes 306 and 308, due to the induced strain by the piezoelectric effect of layer 307. The direction of the actuator displacement is determined in particular by the mechanical asymmetry of the structure relative to the structure's piezoelectric layer 307. The piezoelectric actuator bends due to a piezoelectrically induced bending moment 310 acting about the neutral plane 302. There are two parameters that dictate the direction of motion of a piezoelectric actuator, the sense of the strain within the piezoelectric layer (determines the sense of the piezoelectric actuation force 304) and the relative position of the geometric mid-plane 303 of the piezoelectric layer 307 with respect to the structure's neutral plane or axis 302 (sense of the moment arm 301 of the bending moment 310). For vertical (z axis) actuators, the relevant neutral plane 302 is the x-y neutral plane. For any three-dimensional object, there are three orthogonal neutral planes (axis); x-y, x-z, and y-z. The neutral plane 302 is the location within the structure where there is equal contribution to structural stiffness (resistance to deformation) on either side of the plane and where, under pure bending, the strain is equal to zero. If the strain field of the piezoelectric layer 307 is asymmetric about any of these neutral planes (axis), then it will contribute a component of a bending moment 310 that acts upon the composite structure. For a vertical piezoelectric actuator, the piezoelectric strain field is symmetric about the x-z and y-z neutral planes.

The inability of conventional vertical piezoelectric MEMS unimorph actuators using ferroelectric/piezoelectric materials to attain large negative deflections at high operating voltages is a consequence of the high electric field nonlinear material response. Piezoelectric materials deform when in the presence of an applied electric field. This behavior is due to the electric field induced atomic displacements within the crystalline unit cell of a piezoelectric material. These displacements cause the geometric distortion of the unit cell, and consequently, of the piezoelectric material on the macroscopic scale as well.

Figures 4A, 4B:
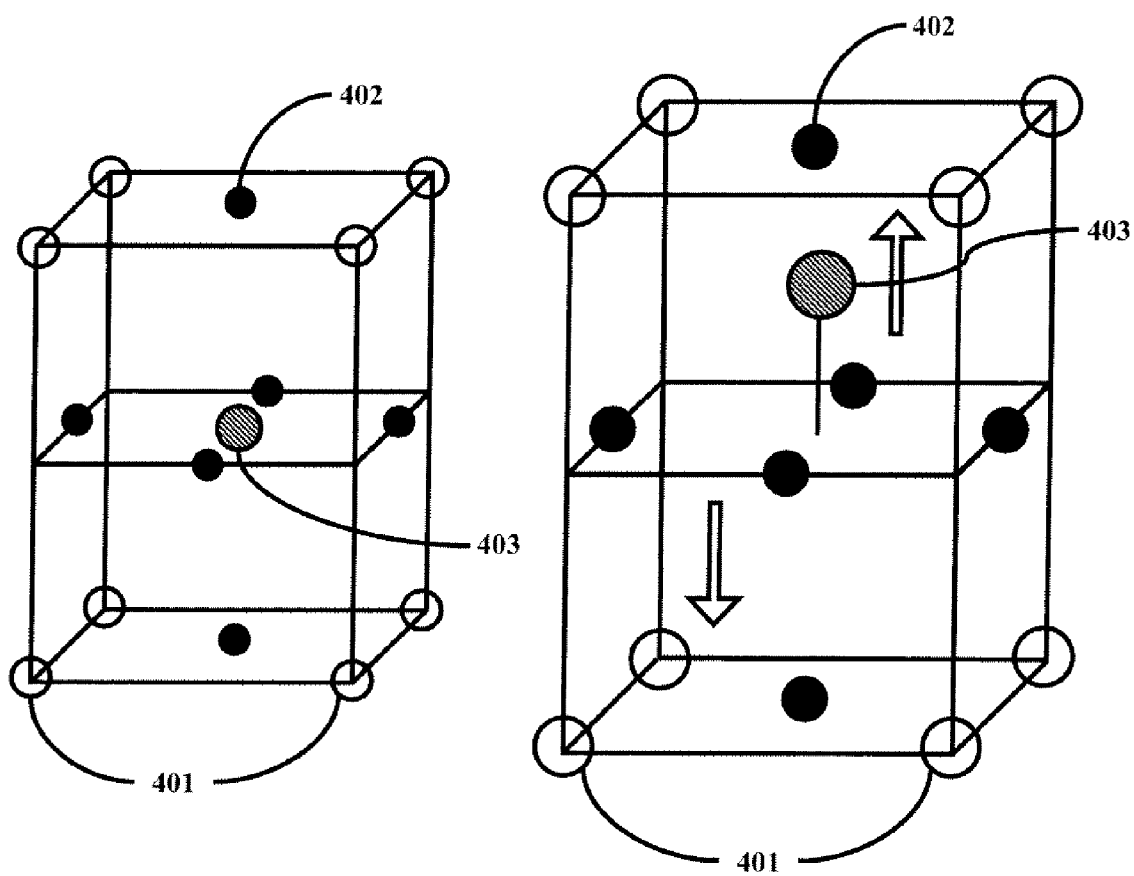
FIGS. 4(A) and 4(B) illustrate a unit cell of lead-zirconate-titanate (PZT)

FIGS. 4(A) and 4(B) illustrate a unit cell of lead-zirconate-titanate (PZT). The cell comprises lead (Pb) atoms 401, a central zirconium (Zr) or titanium (Ti) atom 403 and oxygen (O) atoms 402. The Zr or Ti atoms 403 are in a compositional ratio (e.g. 52/48, 45/55, etc). FIG. 4(A) illustrates a high temperature non-piezoelectric form of PZT with a cubic unit cell; while FIG. 4(B) illustrates a low temperature piezoelectric for of PZT with a tetragonal unit cell where the central atom 403 is displaced from the geometric mid-plane of the cell. The vertical displacement of the central atom 403 represents the poled state of the material and is conditioned with an applied electric field. For small values of an applied electric field, the central atom 403 displaces positively or negatively from its poled position, depending on the polarity of the electric field. At small electric field values, a positive displacement of the central atom 403 creates a net elongation of the unit cell, while a negative displacement creates a net contraction of the unit cell relative to the pole unit cell orientation. For applied electric field values that exceed the value necessary to displace the central atom 403 back to the unit cell mid-plane (i.e., the coercive field), the central atom 403 will continue to displace in the direction of the applied field. Once the central atom 403 continues to displace in the direction of the applied field, the unit cell will no longer experience a net contraction along the in-plane axis, relative to the poled orientation, but will experience a net elongation along the long axis, due to the mirror symmetry of the unit cell about its mid-plane. Thus, for electric fields in excess of the coercive field of the ferroelectric material, only a single sense of the piezoelectric strain is possible and is therefore is independent of applied field polarity. The sense of piezoelectric strain at high field strengths is in-plane contraction and out of plane (long axis) elongation. It is for this reason that the conventional vertical piezoelectric MEMS unimorph actuators using ferroelectric/piezoelectric materials are unable to attain large negative deflections at high operating voltages.

Figure 5A:
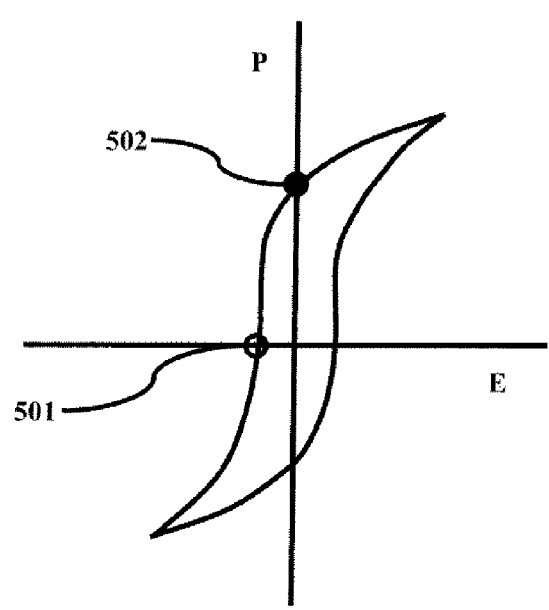
FIGS. 5(A) and 5(B) illustrate a ferroelectric hysteresis loop with an electric field/strain relationship and an electric field/polarization relationship (butterfly loop), respectively, in accordance with embodiments herein.
Figure 5B:
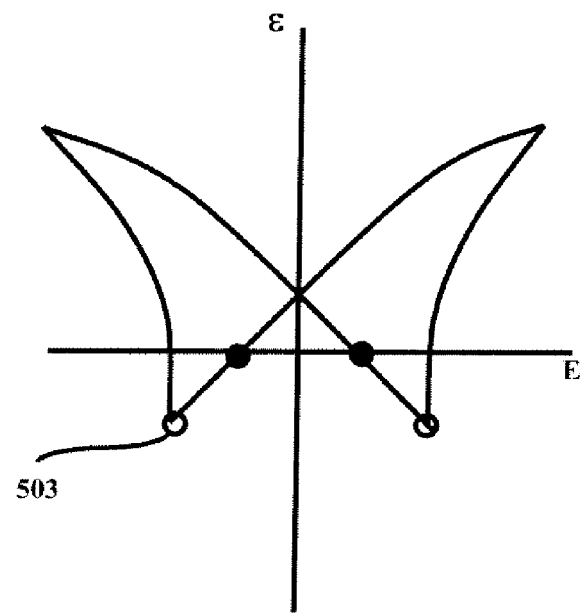

FIGS. 5(A) and 5(B) depict the polarization/electric field plots of a ferroelectric material. FIG. 5(A) depicts the relationship between the applied electric field and polarization within a ferroelectric material while FIG. 5(B) depicts the relationship between the electric field and the strain. The point, where the loop intersects the field axis 501 is the value of the coercive field. The coercive field is the electric field value required to cancel the internal remnant polarization of the ferroelectric material. The same point can be seen in the strain vs. field plot and is labeled as point 503. The point, where the loop intersects the polarization axis 502 is the value of the remnant polarization. The remnant polarization is the measure of residual polarization remaining in the ferroelectric once the applied field has been removed.

The embodiments herein also provide for the combination of a large negative displacement vertical piezoelectric MEMS actuator and a conventional large positive displacement vertical piezoelectric MEMS actuator on the same substrate within the same manufacturing process. When the conventional large positive displacement vertical piezoelectric MEMS actuator is integrated with the large negative displacement vertical piezoelectric MEMS actuator, the devices generally share the same bottom dielectric layer, top and bottom electrode layers, and piezoelectric layer. The integration is accomplished by selecting the thicknesses of the top structural layer of the negative displacement piezoelectric MEMS actuator, the shared piezoelectric layer, and the shared bottom structural dielectric layers to produce optimal displacement, force, or work outputs (for the intended actuator application) of both the co-fabricated large negative displacement vertical piezoelectric MEMS actuator and the conventional large positive displacement vertical piezoelectric MEMS actuator by using the formulas.

$$M_{act} = d_{31} V E_P w (H_{Pmid} - y_{bar})$$

$$y_{bar} = \frac{\sum_i A_i y_i}{A_{tot}}$$

where $M_{act}$ represents the piezoelectric actuation (bending) moment 310, $d_{31}$ is the high electric field effective piezoelectric coefficient, V is the applied voltage, $E_p$ is the elastic modulus of the piezoelectric material, w is the beam width, $y_{bar}$ represents the distance between the x-y neutral axis and an arbitrary reference axis, $A_i$ represents elasticity weighted layer cross sectional areas corresponding to the well known "transformed section method" for composite structures, $y_i$ represents the distance between individual layer centroids and the arbitrary reference axis, $A_{tot}$ represents cross-sectional areas of all the layers in the piezoelectric MEMS actuator, $H_{Pmid}$ represents the distance between the mid-plane of the piezoelectric layer and the arbitrary reference axis. The difference between $H_{Pmid}$ and $y_{bar}$ is the value of the piezoelectric moment arm 301. With the value of the piezoelectric actuation (bending) moment 310, the actuator layer thicknesses and other geometries, and additional well known mechanics equations for force and displacement for various actuator geometries, boundary and loading conditions; optimal actuator performance can be achieved for the integrated positive and negative displacement vertical piezoelectric MEMS actuators.

Figure 7A:
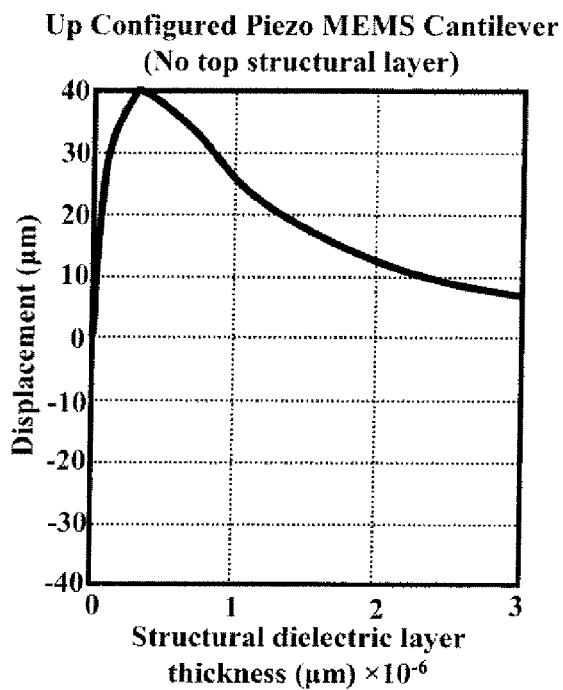
FIGS. 7(A) and 7(B) illustrate cantilever unimorph displacement as a function of bottom dielectric layer thickness and top structural layer thickness respectively.
Figure 7B:
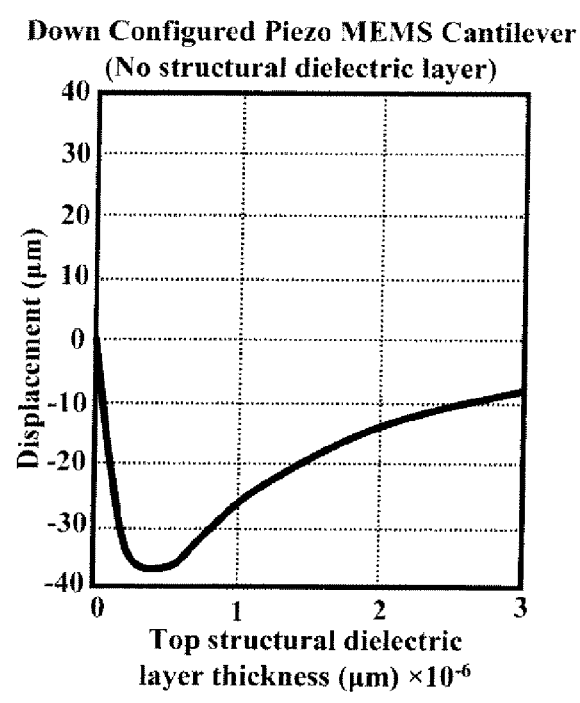

FIG. 7(A) illustrates the displacement of a conventional vertical piezoelectric cantilever actuator, as depicted in FIGS. 1(A) and 1(B), for all relevant parameters fixed and varying the thickness of the bottom structural dielectric layer 104. This plot utilizes the above equations, as well as the following equation for the geometrically nonlinear displacement of a cantilever with an end moment applied, to relate the piezoelectric actuation moment to the cantilever displacement:

$$y_{cant_{tip}} = \frac{(EI)_{comp}}{M_{act}} \left(1 - \cos\left(\frac{M_{act}L}{(EI)_{comp}}\right)\right)$$

where $y_{cant_{tip}}$ is the tip displacement of the cantilever actuator, $EI_{comp}$ is the flexural rigidity of the composite actuator (as also defined by the well-known "transformed section method" for composite structures), L is the cantilever length, and $M_{act}$ is the piezoelectric actuation (bending) moment 310. FIG. 7(A) illustrates that an optimal bottom structural layer thickness exists for maximum displacement of the actuator. FIG. 7(B) illustrates the case where the bottom structural layer 309 of FIGS. 3(A) and 3(B) is absent and the top structural layer 305 is present. This configuration places the x-y neutral axis above the mid-plane of the piezoelectric layer 307.

Figure 8:
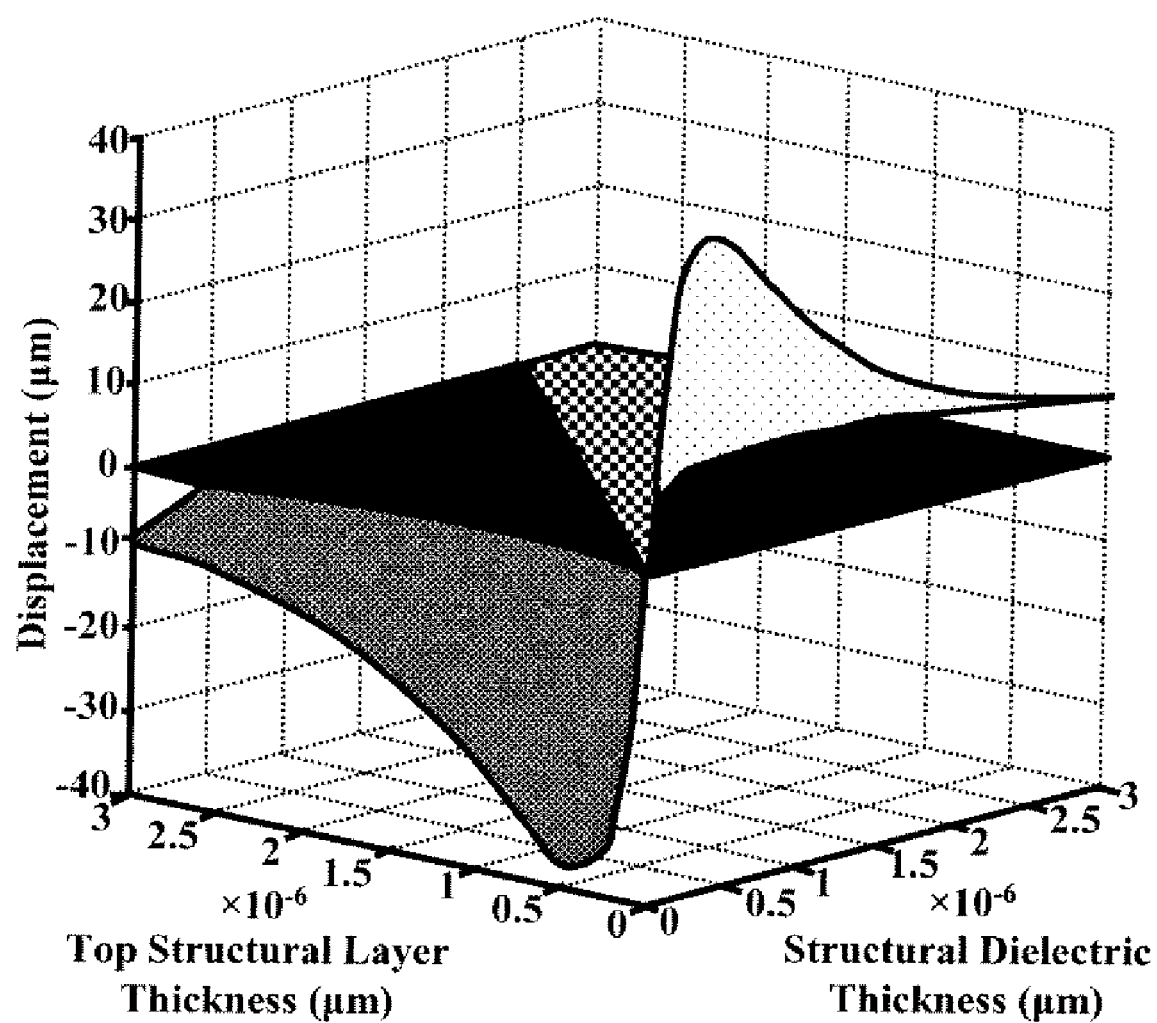
FIG. 8 illustrates the displacement trade-off design space for the cantilever structure illustrated in FIGS. 3(A) and 3(B) as a function the bottom dielectric layer thickness and the top structural layer thickness, wherein the flat dark plane depicts zero displacement.

The structure in FIGS. 3(A) and 3(B) depicts the position of the x-y neutral axis above the geometric mid-plane of the piezoelectric layer. However, FIG. 8 illustrates the free displacement (actuator applies no external force) trade-off design space for the general cantilever structure illustrated in FIGS. 3(A) and 3(B) where this relative position of the neutral axis varies as a function of the bottom dielectric layer thickness and the top structural layer thickness. For example, designs described by points on the surface on the left of the plot of FIG. 8 would have very thick top structural layers and very thin bottom dielectric layers. The opposite is true for designs described by points on the surface on the right of the plot of FIG. 8. The flat dark plane depicts zero displacement. It can be clearly seen that the structure depicted in FIGS. 3(A) and 3(B) does not necessarily operate as a large negative displacement vertical piezoelectric MESAS actuator just through the simple addition of top structural material but rather requires a top structural layer thickness in excess of a critical value. The plot of FIG. 8 also illustrates that, in the case of free displacement, there exist optimal values for the top structural layer thickness given a dielectric structural layer thickness. For the case of integrated devices, the devices must share the bottom dielectric layer and consequently, this design optimization approach described above must provide the relevant layer thicknesses.

Figure 9:
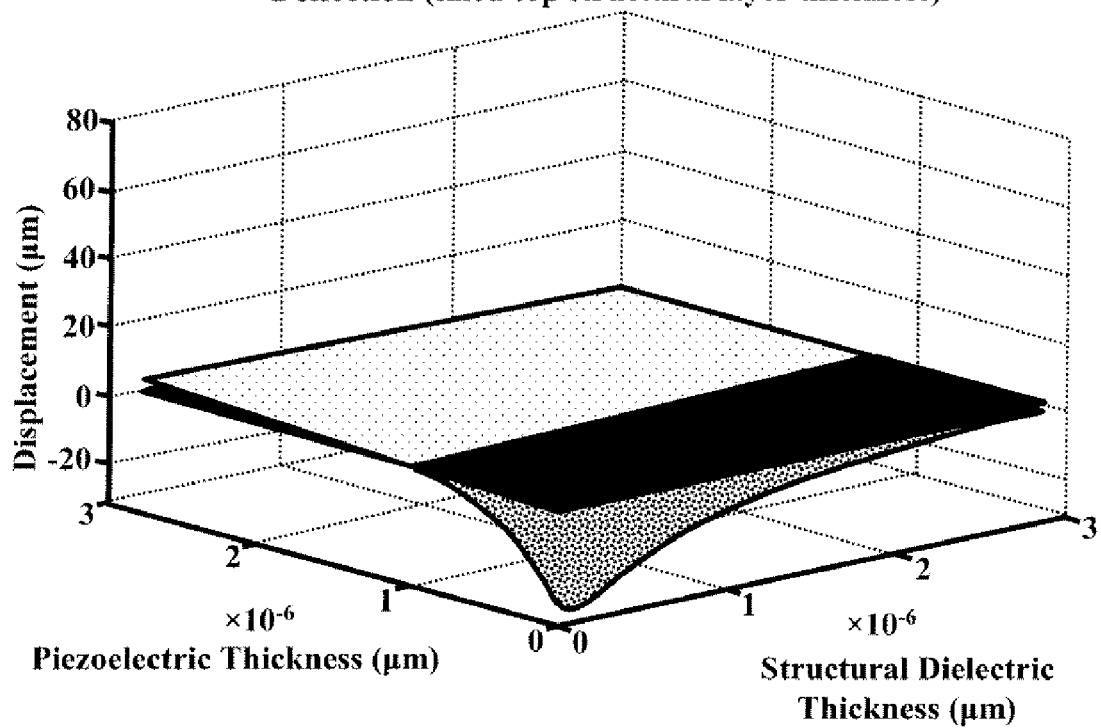
FIG. 9 illustrates the displacement trade-off design space for the cantilever structure depicted in FIG. 3 as a function of the piezoelectric layer thickness and the bottom structural layer thickness, wherein the flat dark plane depicts zero displacement.

FIG. 9 illustrates the free displacement trade-off design space for the general cantilever structure illustrated in FIGS. 3(A) and 3(B) where the relative position of the neutral axis varies as a function of the bottom dielectric layer thickness and the piezoelectric layer thickness. The top structural layer 305 is present and is fixed in value. The flat dark plane depicts zero displacement. Designs corresponding to points on the surface below the dark plane are negative displacement designs. Again, this plot (FIG. 9) illustrates the fact that the general structure depicted in FIGS. 3(A) and 3(B) provides for large negative displacements at high operating voltages only for certain combinations of layer thicknesses. These values are obtained from the equations and method described above. The critical piezoelectric thickness, for a given top structural layer thickness, may appear in the plot to be independent of the bottom dielectric layer thickness but this is not always true and the dependence is typically nonlinear and non-trivial.

Successful integration of a large negative displacement vertical piezoelectric MEMS actuator and a conventional large positive displacement vertical piezoelectric MEMS actuator on the same substrate within the same manufacturing process is achieved for a particular actuator application (in terms of displacement, force, etc.) through the application of the method described above.

The top electrode layer 306 and the top structural layer 305 are offset (in the x-y plane) from the edge of the actuator by a distance typically greater than three microns. The displacement of the top electrode layer 306 and the top structural layer 305 allows the application of large electric fields between the electrode layers without the risk of electrical breakdown of the air between the top and bottom electrode layers by increasing the effective distance between the layers.

Figure 6:
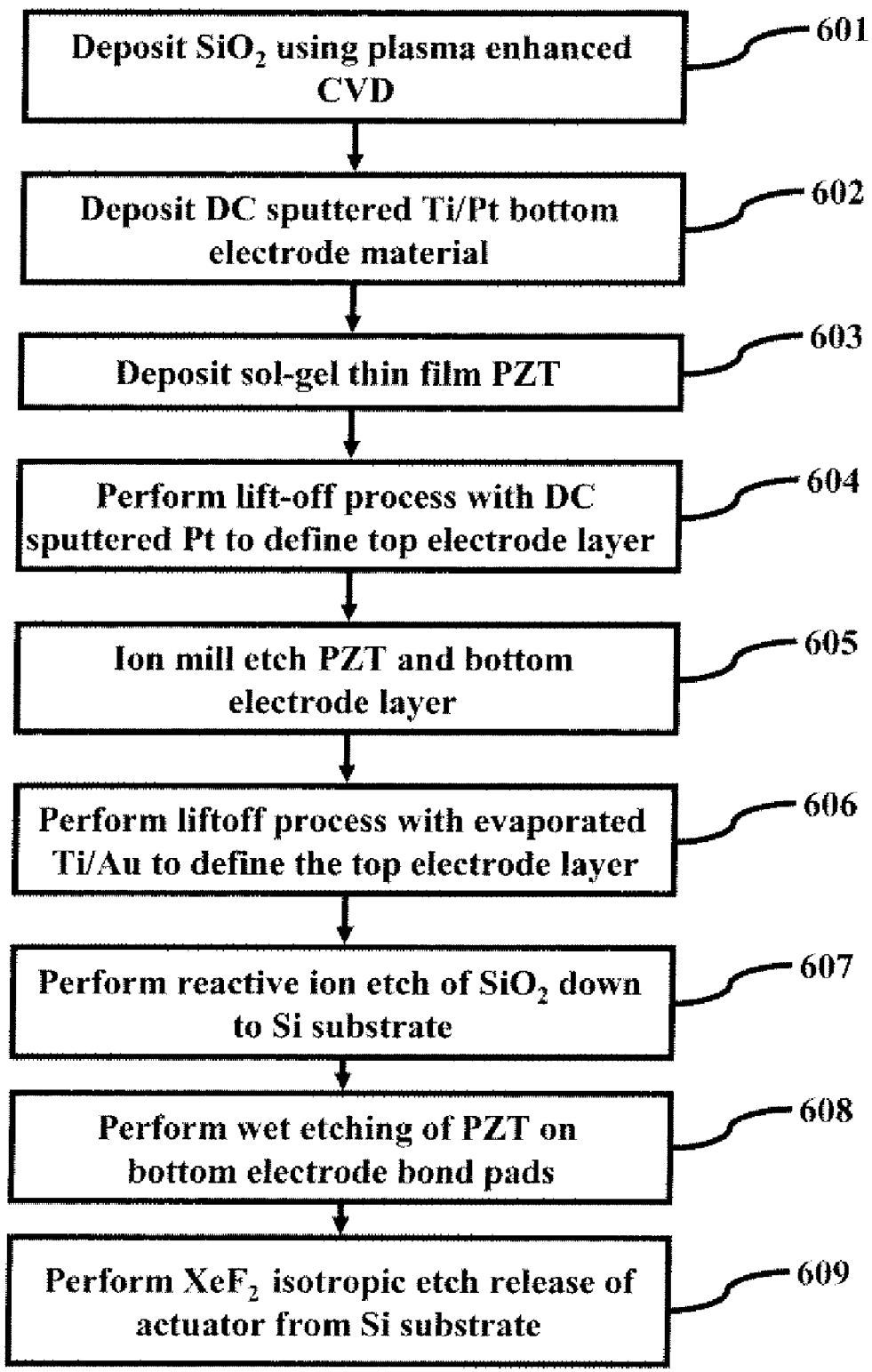
FIG. 6 is a flow diagram illustrating a preferred method of fabrication according to an embodiment herein.

FIG. 6, with reference to FIGS. 3(A) through 5(B), is a flow diagram illustrating a preferred method of fabrication according to an embodiment herein. The starting material and substrate for the fabrication process is a single crystal silicon wafer. However, single crystal silicon wafer has been cited as an example, and other materials may be used as substrate. A layer of $SiO_2$, having a thickness of 1200 Å is deposited (601) using plasma enhanced chemical vapor deposition (CVD). The deposition is performed at a temperature of 700 ° C. in a nitrogenous ($N_2$) atmosphere with annealing done for 60 seconds. DC sputtered Ti/Pt is deposited (602) as the bottom electrode layer 308. The bottom electrode layer 308 is of thickness 100 Å for the Ti and 600 Å for the Pt. Sol-gel thin film piezoelectric layer (PZT) 307 of thickness 5000 Å is deposited (603) above the bottom electrode layer 308. A liftoff process is performed (604) with DC sputtered PT to define the top electrode layer 306, of thickness 700 Å. The liftoff process is a patterning process involving the creation of patterns on the wafer surface through an additive process, without etching. The piezoelectric layer 307 and bottom electrode layer 308 are ion mill etched (605) to define the actuator down to the $SiO_2$ layer. A liftoff process is performed (606) with evaporated Ti/Au to define the top structural layer 305 of active negative deflection actuator, with a thickness varying from 200 Å to 9800 Å. The thickness of the top structural layer 305 can be chosen to provide maximum attainable displacement by the x-y neutral plane 302 Just above the top electrode/piezoelectric layer interface. Reactive ion etching (RIE) of $SiO_2$ is performed (607) down to the Si substrate. Wet etching of PZT is performed (608) to create bottom electrode bond pads (not shown). Thereafter, $XeF_2$ isotropic etch release of the actuator from the Si substrate is performed (609).

The embodiments herein are not restricted to the fabrication process, as mentioned above. It is evident to a person skilled in the art that the steps listed are not exclusive and the piezoelectric stack, as described, can be fabricated using other fabrication processes. It is also evident to a person skilled in the art that the thickness of the layers mentioned are approximate values and are subject to change with design preferences as described above.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A co-fabricated vertical piezoelectric microelectromechanical systems (MEMS) actuator that achieve large positive and negative displacements through operating electric fields in excess of the coercive field, said MEMS actuator comprising:
   a large negative displacement vertical piezoelectric MEMS actuator,
   a substrate layer;
   a bottom structural dielectric layer above said substrate layer;
   a bottom electrode layer above said structural dielectric layer;
   an active piezoelectric layer above said bottom electrode layer;
   a top electrode layer above said active piezoelectric layer;
   a top structural layer above said top electrode layer,
   wherein the x-y neutral plane of the negative displacement vertical piezoelectric MEMS actuator is above the mid-plane of the active piezoelectric layer,
   wherein said negative displacement vertical piezoelectric MEMS actuator is patterned as a compliant structure,
   wherein said negative displacement vertical piezoelectric MEMS actuator is anchored to said substrate at at least one location and is partially released from said substrate to allow free motion of said actuator, and
   wherein said large negative displacement vertical piezoelectric MEMS actuator and a large positive displacement vertical piezoelectric MEMS actuator are positioned on the same said substrate within the same manufacturing process,
   wherein the thicknesses and elastic material properties of the bottom structural dielectric layer, said bottom electrode layer, said active piezoelectric layer, said top electrode layer, and said top structural layer of said negative displacement piezoelectric MEMS actuator are selected to position the x-y neutral plane of the actuator above the mid-plane of the active piezoelectric layer and to achieve a predetermined actuator force and displacement performance and,
   wherein each actuator is co-formed together by:
   forming a bottom structural dielectric layer common to both actuators above a common substrate layer;
   forming a bottom electrode layer common to both said actuators above said structural dielectric layer;
   forming an active piezoelectric layer common to both said actuators above said bottom electrode layer,
   forming a top electrode layer common to both said actuators above said active piezoelectric layer;
   forming a top structural layer above said top electrode layer of said large negative displacement vertical piezoelectric MEMS actuator,
   wherein the x-y neutral plane of the negative displacement vertical piezoelectric MEMS actuator is above the mid-plane of the active piezoelectric layer,
   wherein the x-y neutral plane of the large positive displacement vertical piezoelectric MEMS actuator is below the mid-plane of the active piezoelectric layer,
   wherein said actuators are patterned as compliant structures,
   wherein said actuators are each anchored to said substrate at at least one location and are partially released from said substrate to allow free motion of said actuators; and
   selecting the thicknesses and elastic material properties of said top structural layer of the negative displacement piezoelectric MEMS actuator, said common active piezoelectric layer, and the common bottom structural dielectric layer to achieve a predetermined actuator force and displacement performance of both of the actuators.

2. The MEMS actuator of claim 1, wherein said top structural layer and said top electrode layer are offset in an x-y plane from an edge of said piezoelectric actuator by a distance that prevents dielectric breakdown of the air between the electrode layers.

3. The MEMS actuator of claim 1, wherein said top electrode layer and the top structural layer are offset in the x-y plane from the edge of the actuator by a length greater than three microns.

* * * * *